United States Patent
Zhang et al.

(10) Patent No.: US 10,199,264 B2
(45) Date of Patent: Feb. 5, 2019

(54) SELF ALIGNED INTERCONNECT STRUCTURES

(71) Applicant: GLOBALFOUNDRIES INC., Grand Cayman (KY)

(72) Inventors: Xunyuan Zhang, Albany, NY (US); Roderick A. Augur, Saratoga Springs, NY (US); Hoon Kim, Horseheads, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/875,212

(22) Filed: Jan. 19, 2018

(65) Prior Publication Data

US 2018/0151504 A1 May 31, 2018

Related U.S. Application Data

(62) Division of application No. 15/363,513, filed on Nov. 29, 2016, now Pat. No. 9,922,929.

(51) Int. Cl.
| | | |
|---|---|---|
| *H01L 21/768* | (2006.01) | |
| *H01L 23/522* | (2006.01) | |
| *H01L 23/532* | (2006.01) | |

(52) U.S. Cl.
CPC .... *H01L 21/7682* (2013.01); *H01L 21/76883* (2013.01); *H01L 21/76885* (2013.01); *H01L 21/76897* (2013.01); *H01L 23/5221* (2013.01); *H01L 23/53242* (2013.01); *H01L 23/53295* (2013.01)

(58) Field of Classification Search
CPC ........ H01L 21/70; H01L 21/702; H01L 21/71
See application file for complete search history.

(56) References Cited

U.S. PATENT DOCUMENTS

| | | |
|---|---|---|
| 5,374,454 A | 12/1994 | Bickford et al. |
| 2003/0008417 A1* | 1/2003 | Suzuki ............. H01L 21/31604 438/3 |
| 2008/0029879 A1 | 2/2008 | Tuckerman et al. |
| 2012/0068346 A1 | 3/2012 | Ponoth et al. |
| 2014/0197538 A1 | 7/2014 | Lu et al. |

* cited by examiner

*Primary Examiner* — Cheung Lee
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to self-aligned interconnect structures and methods of manufacture. The structure includes an interconnect structure which is self-aligned with an upper level via metallization, and both the interconnect structure and the upper level via metallization are composed of a Pt group material.

18 Claims, 5 Drawing Sheets

US 10,199,264 B2

SELF ALIGNED INTERCONNECT STRUCTURES

FIELD OF THE INVENTION

The present disclosure relates to semiconductor structures and, more particularly, to self-aligned interconnect structures and methods of manufacture.

BACKGROUND

Interconnect structures are used in semiconductor manufacturing to connect active and passive devices or structures at different wiring levels of the chip. Interconnect structures can be composed of different metal or metal alloy materials such as, e.g., tungsten (W) or copper (Cu). For example, middle of the line processes typically include tungsten; whereas, back end of the line processes typically include copper.

By virtue of continued scaling of device technologies, interconnect structures need to be reduced in size. For example, interconnect structures with dimensions of less than 20 nm are now required in many semiconductor processes. As the interconnect structures scale downwards, different metals or metal alloys are required with lower resistivities in order to improve device performance.

SUMMARY

In an aspect of the disclosure, a structure comprises an interconnect structure which is self-aligned with an upper level via metallization, and both the interconnect structure and the upper level via metallization are composed of a Pt group material.

In an aspect of the disclosure, a structure comprises: a metallization feature at a first level composed of a Pt group material; an interconnect structure which is formed from the metallization feature and is composed of the Pt group material; an airgap provided in dielectric material, directly adjacent to the interconnect structure; and an upper level via metallization in direct electrical and physical contact with the interconnect structure and which is composed of the Pt group material and which is self-aligned with the interconnect structure below.

In an aspect of the disclosure, a method comprises: forming a first metallization structure composed of a Pt group material; recessing the first metallization structure; forming a second of metallization structure of the Pt group material on the first metallization structure; and forming a trench at the first metallization structure such that the first metallization structure and the second metallization structure are self-aligned.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to self-aligned interconnect structures and methods of manufacture. More specifically, the present disclosure relates to interconnect structures which are compatible with etch and wet clean processes and which provide low resistivity. In embodiments, the interconnect structures are manufactured using Pt group metals including, e.g., ruthenium (Ru), rhodium (Rh), palladium (Ps), Iridium (Ir), Osmium (Os), and platinum (Pt). The materials from the platinum (Pt) group can be used as an alternative to tungsten or copper interconnects, as the resistivity of the platinum group is lower than copper and tungsten at smaller dimensional sizes. This is due to the fact that the platinum (Pt) group of materials exhibit larger grains for lower resistance. Also, advantageously, the structures and methods disclosed do not exhibit any significant damage to the interconnect structures during etching and wet clean processes, resulting in improved interconnect reliability and yields.

In more specific embodiments, the present disclosure provides structures and methods of forming low resistance Pt group metal interconnect structures. The Pt group metal interconnect structures can be formed by a subtractive etching to form lower level trench and via structures, as well as subtractive etching to form an upper level metallization followed by an over etch into the lower level via to form self-aligned interconnect structure. In this way, the interconnect structure comprising a Pt group metal interconnect can have via self-aligned contacts. Also, an airgap can be provided near the via. And, advantageously, there is no requirement for a dielectric cap between the bottom level and the upper level, which provides considerable cost savings and manufacturing time.

The interconnect structures of the present disclosure can be manufactured in a number of ways using a number of different tools. In general, though, the methodologies and tools are used to form structures with dimensions in the micrometer and nanometer scale. The methodologies, i.e., technologies, employed to manufacture the interconnect structures of the present disclosure have been adopted from integrated circuit (IC) technology. For example, the interconnect structures are built on wafers and are realized in films of material patterned by photolithographic processes on the top of a wafer. In particular, the fabrication of the metallization structure uses three basic building blocks: (i) deposition of thin films of material on a substrate, (ii) applying a patterned mask on top of the films by photolithographic imaging, and (iii) etching the films selectively to the mask.

Figure 1:
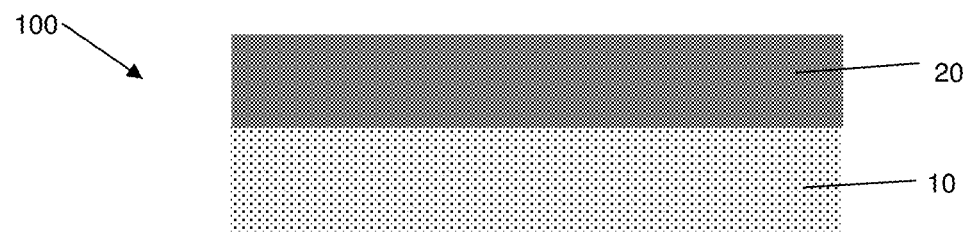
FIG. 1 shows a structure and respective fabrication processes in accordance with aspects of the present disclosure.

FIG. 1 shows a structure and respective fabrication processes in accordance with aspects of the present disclosure. More specifically, the structure 100 includes a layer of Pt group material 20 formed on a contact or substrate 10. In embodiments, the layer of Pt group material 20 is formed by conventional deposition methods known to those of skill in the art. For example, the deposition of the Pt group material 20 can be applied by, e.g., chemical vapor deposition (CVD) or physical vapor deposition (PVD) processes. The layer of Pt group of materials 20 can include, e.g., Ru, Rh, Pt, Ir, Os and Pd. The layer of Pt group material 20 may also be annealed in a hydrogen at an ambient temperature higher than 400° C. (Celsius) in order to grow the grains of the Pt group material 20. The annealing process will thus improve interconnect structure reliability and yield.

Figure 2A:
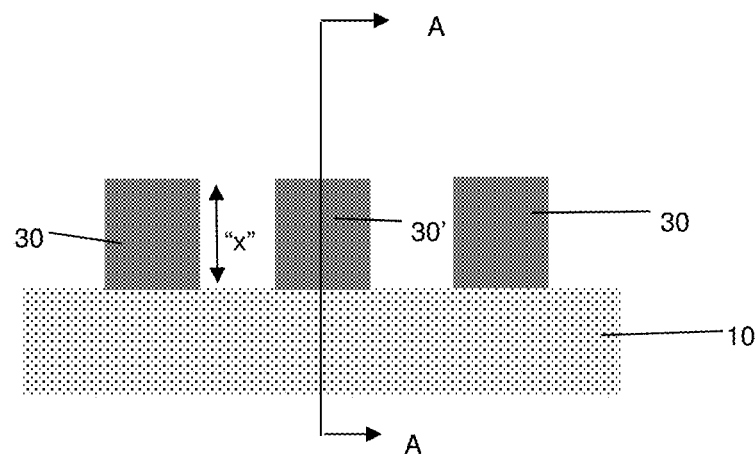
FIG. 2A shows metallization structures, amongst other features, and respective fabrication processes in accordance with aspects of the present disclosure.
Figure 2B:
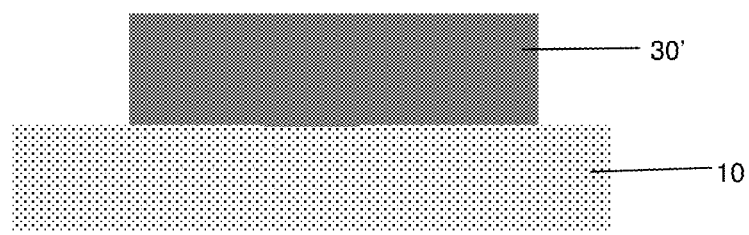
FIG. 2B shows a cross-section of FIG. 2A, along line A-A.

FIGS. 2A and 2B show metallization structures, amongst other features, and respective fabrication processes in accordance with aspects of the present disclosure. More specifically, as shown in FIGS. 2A and 2B, the layer of Pt group material 20 can be patterned to form interconnect structures 30 and wiring structures 30' (hereinafter referred to generally as metallization or interconnect or wiring structures based on a particular wiring level of the structure).

In embodiments, the metallization structures 30, 30' can be formed into wiring and/or interconnect structures depending on a particular wiring level of the structure. For example, in embodiments, the metallization structures 30, 30' can include a height "x", which is equivalent to a trench and via height for a metallization and interconnect via structure. These different structures can be formed by a subtractive etching method. By way of example, a hardmask or resist can be deposited on the layer of Pt group material 20 and patterned to form openings. The hardmask can be a nitride layer and more specifically TiN. The layer of Pt group material 20 then undergoes a subtractive etching process, e.g., reactive ion etching (RIE), to form the wiring and/or interconnect structures 30, 30'. In more specific embodiments, the subtractive etching can be a $O_2/Cl_2$ plasma etching process. The hardmask material or resist is then removed by conventional processes.

Figure 3A:
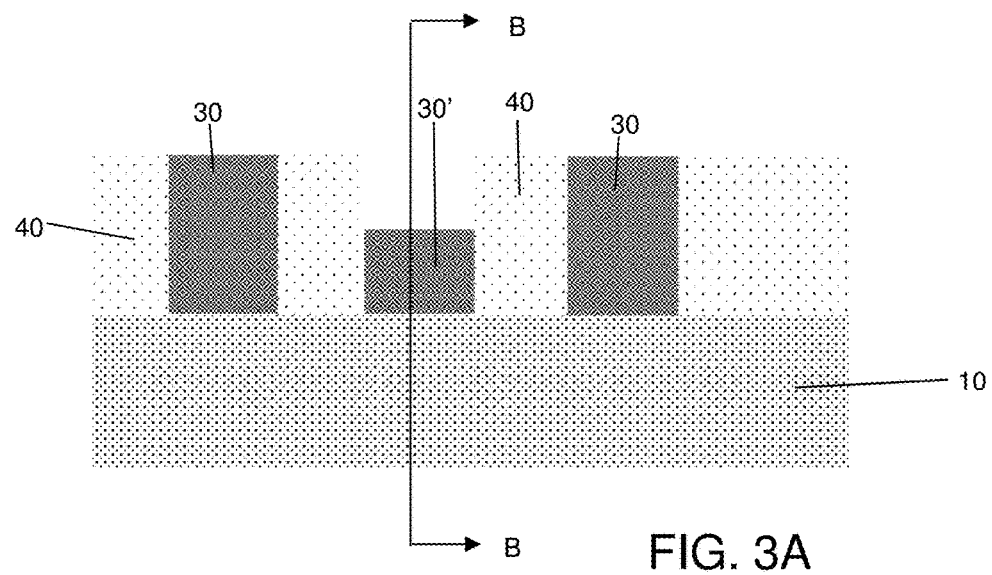
FIG. 3A shows a recessed portion of a metallization structure, amongst other features, and respective fabrication processes in accordance with aspects of the present disclosure.
Figure 3B:
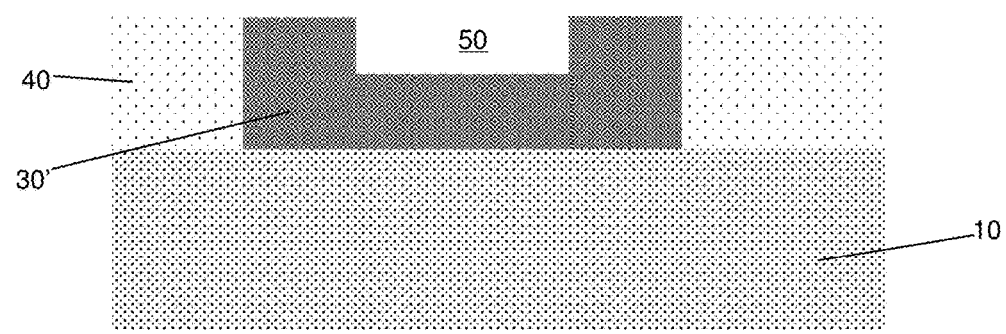
FIG. 3B shows a cross-sectional view of FIG. 3A, along line B-B.
Figure 3C:
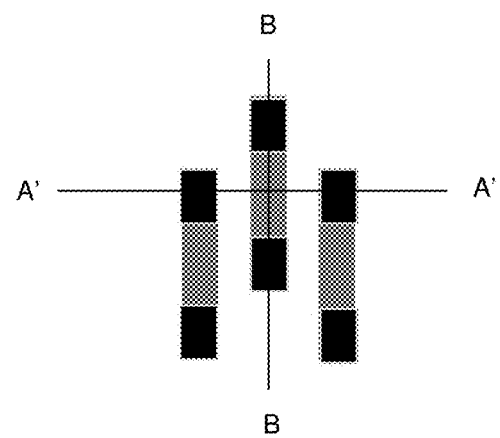
FIG. 3C shows a top view of FIGS. 3A and 3B.

FIGS. 3A-3C show different views of the structures and respective fabrication processes. For example, FIG. 3A shows a side view of the metallization structures, with FIG. 3B being a cross-sectional view along line B-B of FIG. 3A and FIG. 3C. FIG. 3C is a top view of the structures shown in FIGS. 3A and 3B, with FIG. 3A being a cross-sectional view of FIG. 3C along line A'-A'.

As shown in these figures, an insulator layer 40 is formed on the metallization structures 30, 30' of Pt group material. In embodiments, the insulator layer 40 can be an oxide material formed by a conventional deposition method, e.g., CVD processes. The oxide layer 40 layer can be planarized to a level of the metallization structures 30, 30' using a conventional chemical mechanical polishing (CMP) process. In this way, the oxide layer 40 will be planar with the metallization structures 30, 30'.

Still referring to FIGS. 3A-3C, a resist or hardmask is formed on the insulator layer 40 and exposed surfaces of the metallization structures 30, 30'. The resist can be patterned by exposure to light, followed by an etching process to recess a portion of an upper portion of an interconnect structure (which, for example, can be fabricated by an inverted dual damascene process. In embodiments, the etching process is a timed RIE process using, e.g., $O_2/Cl_2$ plasma etching process, to form a recess 50 within the metallization structures 30'. In this way, a portion of the metallization structure 30' can be lower in height (e.g., a height of a trench) than the remaining metallization structures 30' (which is a height of the via and trench (when compared to a dual damascene process)), where the lower portion can subsequently be used as a lower wiring layer, at level M1 of the structure, and the upper portions can subsequently be patterned into an interconnect structure.

Figure 4A:
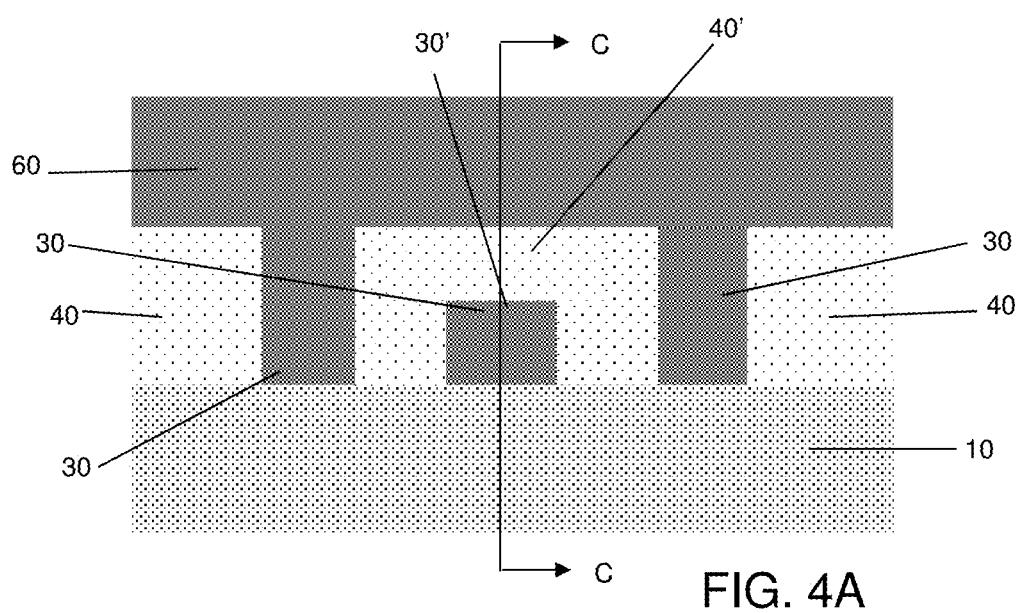
FIG. 4A shows an upper metallization structure, amongst other features, and respective fabrication processes in accordance with aspects of the present disclosure.
Figure 4B:
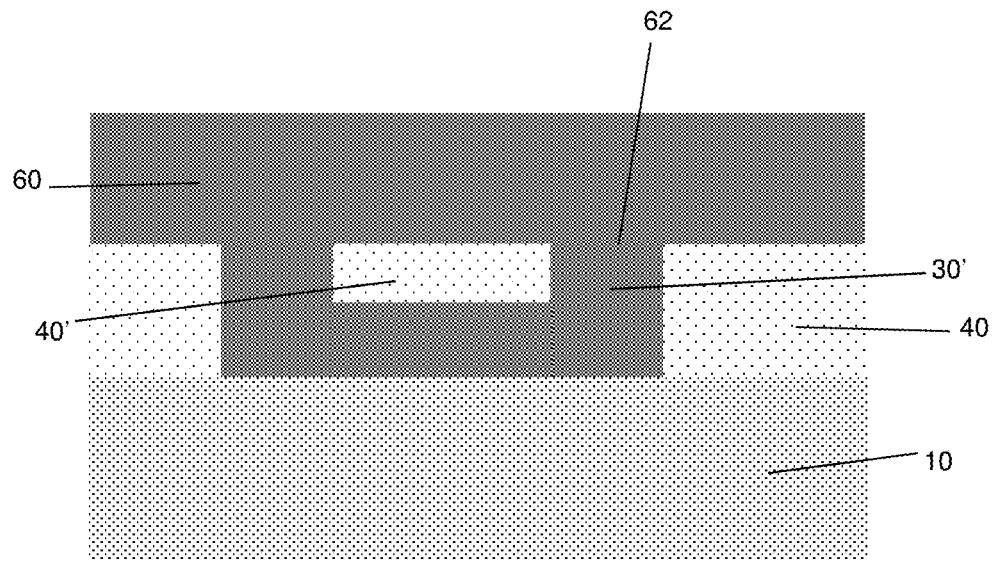
FIG. 4B shows a cross-sectional view of FIG. 4A, along line C-C.

FIG. 4A shows an upper metallization structure, amongst other features, and respective fabrication processes in accordance with aspects of the present disclosure. FIG. 4B shows a cross-sectional view of FIG. 4A, along line C-C. More specifically, in FIGS. 4A and 4B, an insulator material 40' fills in the recess 50 of the metallization structure 30' and, more specifically, the insulator material 40' is blanket deposited, e.g., CVD, over the metallization structures 30, 30', followed by a CMP process. In this way, the insulator material 40' can be planar with the surfaces of the metallization structures 30 as shown in FIG. 4A and portions of the metallization structure 30' as shown in FIG. 4B. In embodiments, the insulator material 40' can be an oxide material.

Still referring to FIGS. 4A and 4B, following the CMP process, a metallization structure 60 at an upper level, e.g., M2 level, is deposited on the exposed surfaces of the interconnect structures 30, 30'. In embodiments, the metallization structure 60 can be a wiring structure composed of material selected from the Pt group of materials, preferably Ru. In this way, the metallization structure 60 is in direct physical and electrical contact with the metallization structures 30, 30', without the need for a capping material at the interface 62 of these materials. More specifically, as both the metallization structures 30, 30' and the metallization structure 60 is formed from material selected from the Pt group, there will be no diffusion or oxygen contamination during etching or wet clean processes or usage, hence eliminating the need to have a capping material as in conventional interconnect structures.

Figure 5A:
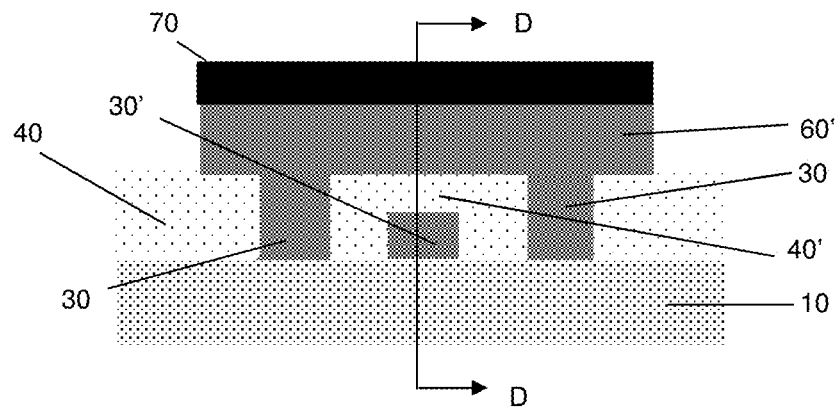
FIGS. 5A-5C show different views of upper interconnect/wiring structures, amongst other features, and respective fabrication processes.
Figure 5B:
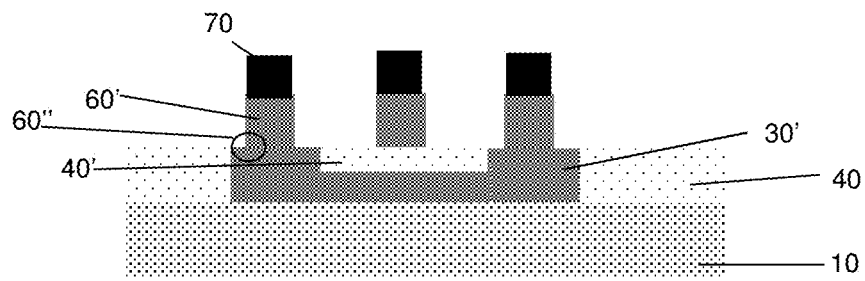
Figure 5C:
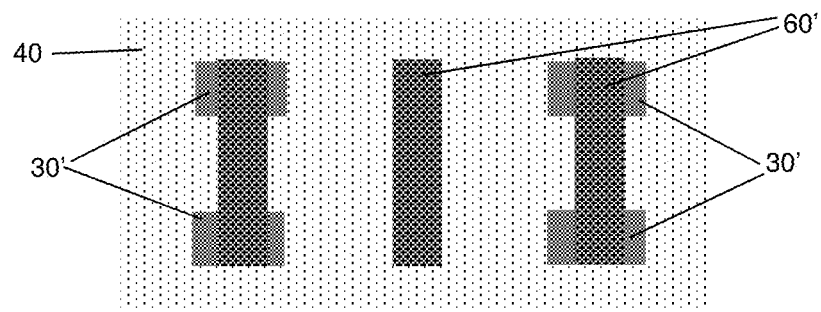

FIGS. 5A-5C show different views of an upper interconnect/wiring structures, amongst other features, and respective fabrication processes. For example, FIGS. 5A and 5B show different side views of the structure, with FIG. 5B being a side view of FIG. 5A along line D-D; whereas, FIG. FIG. 5C shows a top-down view of FIG. 5A and FIG. 5B (without the mask). More specifically, as shown in FIGS. 5A-5C, the metallization structure 60 is patterned by conventional lithography and etching processes to form interconnect and/or wiring structures 60'. By way of example, a resist 70 formed over the metallization structure 60 is exposed to light to form openings (patterns). An etching (e.g., RIE process using $O_2/Cl_2$ plasma) is then performed through the openings to form the interconnect and/or wiring structures 60'. As noted in FIG. 5B, though, the upper level metallization structures 60' contacting the metallization structure 30' is not self-aligned with a lower level via interconnect structure at this fabrication stage, as represented by reference numeral 60"; whereas, the upper level metallization structures 60' and the metallization structure 30 are self-aligned (which is perpendicular to the combination of the upper level metallization structures 60' and the metallization structure 30'). That is, the lower level (M1) of the structure, e.g., metallization structure 30' has a dimension larger than the upper level (M2) of the metallization structures 60'.

Figure 6:
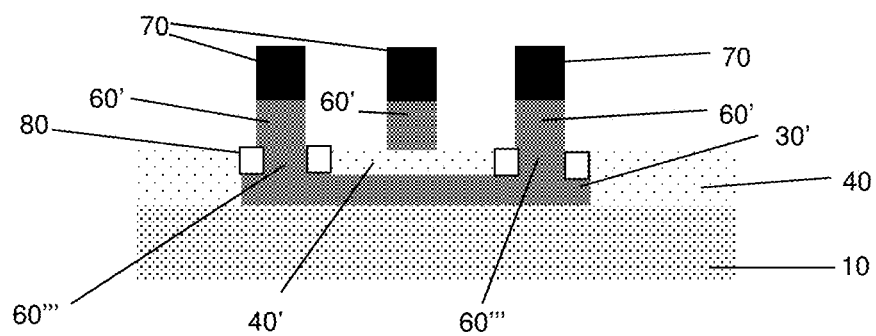
FIG. 6 shows a self-aligned interconnect structure using a trench feature, amongst other features, and respective fabrication processes in accordance with aspects of the present disclosure.

FIG. 6 shows a self-aligned structure using a trench or recess process, amongst other features, and respective fabrication processes in accordance with aspects of the present disclosure. More specifically, a trench 80 is formed on the side of the metallization structure 30' by an over etching process, e.g., $O_2/Cl_2$ plasma, while the remaining portions of the metallization structures 30, 30' remain protected by resist or other hardmask material. In this way, a lower interconnect structure 60''' can be formed in self alignment with an upper metallization structure, e.g., wiring structure 60', effectively extending the interconnect structure to a next level of the structure, e.g., a wiring structure at a higher level (level M2 or above). The interface between the lower interconnect structure 60''' and the upper level via or the interconnect structure 60' will be devoid of a capping material, e.g., dielectric capping material.

Figure 7:
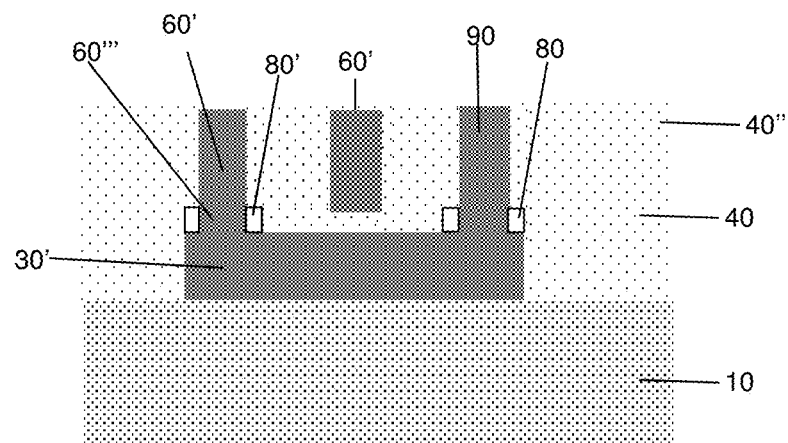
FIG. 7 shows a structure and respective fabrication processes in accordance with aspects of the present disclosure.

FIG. 7 shows a structure and respective fabrication processes in accordance with aspects of the present disclosure. As shown in this view, a dielectric material 40'' is deposited over the trench, thereby forming an airgap 80' on the side o the interconnect structure 60''' formed from the metallization structure 30, 30' (between an upper and lower level of the device, e.g., M1 and M2 level). As should be understood by those of skill in the art, the dielectric material 40'' will also be deposited on any exposed surface of the interconnect structure 30' (and interconnect structure 30), in addition to the insulator layer 40, 40'. In embodiments, the dielectric material 40'' can be any interlevel dielectric material, e.g., oxide, deposited by a conventional deposition process, e.g., CVD.

Still referring to FIG. 7, following the deposition process, trenches are formed in the dielectric material 40'' using conventional lithography and etching process, as described herein. The trenches are then filled with metal material 90 to form the upper wiring layers. The metal material 90 can be selected from the Pt group such as, for example, Ru material. Any residual material on the surface of the dielectric material 40'' can be removed by a CMP process, which will also planarize the surface of the dielectric material 40''. The processes described herein can then continue to upper layers of the structure, e.g., using the steps and related features of FIGS. 1-7.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    forming a first metallization structure composed of a Pt group material;
    recessing the first metallization structure;
    forming a second of metallization structure of the Pt group material on the first metallization structure; and
    forming a trench at the first metallization structure such that the first metallization structure and the second metallization structure are self-aligned,
    wherein the trench is formed by an overetching of a non-recessed portion of the first metallization structure.

2. The method of claim 1, wherein the forming of the first metallization structure and the second metallization structure are provided by a substantive etching process.

3. The method of claim 1, wherein the trench is formed into an airgap by deposition of insulator material.

4. The method of claim 1, wherein the Pt group material is Ru.

5. The method of claim 4, further comprising annealing the Ru of the first metallization structure.

6. A method comprising:
    forming an interconnect structure composed of a lower wiring layer and an interconnect portion extending from the lower wiring layer, the interconnect portion being self-aligned and in direct contact with an upper level via metallization,
    forming an airgap in dielectric material above the lower wiring layer and adjacent to the interconnect portion,
    wherein the interconnect structure including the lower wiring layer and the interconnect portion as well as the upper level via metallization are composed of a Pt group material.

7. The method of claim 6, wherein the interconnect structure and the upper level via metallization are devoid of a dielectric capping material at an interface.

8. The method of claim 6, wherein the interconnect structure is composed of Ru.

9. The method of claim 6, wherein the interconnect structure is composed of one of Ru, Rh, Pt, Ir, Os and Pd.

10. The method of claim 6, further comprising annealing the Pt group material.

11. The method of claim 6, wherein the interconnect structure and the upper level via metallization are of a same metallization.

12. The method of claim 6, wherein the interconnect structure and the upper level via metallization are in direct physical and electrical contact with one another, devoid of a capping material.

13. A method comprising:
    forming a metallization feature at a first level composed of a Pt group material;
    forming an interconnect structure which is formed from the metallization feature and is composed of the Pt group material;
    forming an airgap provided in dielectric material, directly adjacent to the interconnect structure; and
    forming an upper level via metallization in direct electrical and physical contact with the interconnect structure and which is composed of the Pt group material and which is self-aligned with the interconnect structure below.

14. The method of claim 13, wherein the airgap is formed below the upper level via metallization.

15. The method of claim 14, wherein the interconnect structure and the upper level via metallization are devoid of a dielectric capping material at an interface.

16. The method of claim 14, wherein the Pt group material is Ru.

17. The method of claim 16, wherein the Pt group material is an annealed metal.

18. The method of claim 14, wherein the Pt group material is one of Ru, Rh, Pt, Ir, Os and Pd.

* * * * *